(12) United States Patent
Xiong et al.

(10) Patent No.: US 11,923,028 B2
(45) Date of Patent: *Mar. 5, 2024

(54) REFERENCE VOLTAGE ADJUSTMENT BASED ON POST-DECODING AND PRE-DECODING STATE INFORMATION

(71) Applicant: Innogrit Technologies Co., Ltd., Shanghai (CN)

(72) Inventors: Chenrong Xiong, San Jose, CA (US); Jie Chen, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/980,474

(22) Filed: Nov. 3, 2022

(65) Prior Publication Data

US 2023/0078705 A1    Mar. 16, 2023

Related U.S. Application Data

(63) Continuation of application No. 17/140,472, filed on Jan. 4, 2021, now Pat. No. 11,521,700.

(51) Int. Cl.
| | |
|---|---|
| *G11C 29/42* | (2006.01) |
| *G11C 29/12* | (2006.01) |
| *G11C 29/18* | (2006.01) |
| *G11C 29/44* | (2006.01) |
| *G11C 29/50* | (2006.01) |

(52) U.S. Cl.
CPC ........ *G11C 29/42* (2013.01); *G11C 29/12005* (2013.01); *G11C 29/18* (2013.01); *G11C 29/44* (2013.01); *G11C 29/50004* (2013.01); *G11C 2029/1202* (2013.01); *G11C 2029/1802* (2013.01)

(58) Field of Classification Search
None
See application file for complete search history.

(56) References Cited

U.S. PATENT DOCUMENTS

| | | | | |
|---|---|---|---|---|
| 8,924,824 | B1* | 12/2014 | Lu | G06F 11/1072 365/185.24 |
| 9,563,502 | B1* | 2/2017 | Alhussien | G11C 11/5642 |
| 2010/0091535 | A1* | 4/2010 | Sommer | G11C 16/04 365/45 |
| 2011/0044101 | A1* | 2/2011 | Chou | G11C 16/34 365/189.05 |
| 2013/0124944 | A1* | 5/2013 | Eun | G06F 11/1072 711/E12.008 |

(Continued)

*Primary Examiner* — J. H. Hur
(74) *Attorney, Agent, or Firm* — IPro, PLLC

(57) ABSTRACT

Systems and methods are provided for tracking read reference voltages used for reading data in a non-volatile storage device. A method may comprise collecting pre-decoding state information for a read reference voltage by reading data stored in a non-volatile storage device using the read reference voltage, collecting post-decoding state information for the read reference voltage after decoding the data, generating a comparison of probability of state errors for the read reference voltage based on the pre-decoding state information and post-decoding state information, obtaining an adjustment amount to the read reference voltage based on the comparison of probability of state errors; and adjusting the read reference voltage by applying the adjustment amount to the read reference voltage to obtain an adjusted read reference voltage.

14 Claims, 4 Drawing Sheets

(56) References Cited

U.S. PATENT DOCUMENTS

| | | | |
|---|---|---|---|
| 2013/0163328 A1* | 6/2013 | Karakulak | G11C 16/26 |
| | | | 365/185.18 |
| 2015/0200688 A1* | 7/2015 | Pan | G06F 11/10 |
| | | | 714/794 |
| 2017/0125114 A1* | 5/2017 | Alhussien | H03M 13/1108 |
| 2019/0043588 A1* | 2/2019 | Fisher | G11C 16/26 |

\* cited by examiner

REFERENCE VOLTAGE ADJUSTMENT BASED ON POST-DECODING AND PRE-DECODING STATE INFORMATION

TECHNICAL FIELD

The disclosure herein relates to reference voltages for reading data in non-volatile storage devices, particularly relates to finding the optimal reference voltages based on post-decoding and pre-decoding state information.

BACKGROUND

The evolution of the modern computing system is driven in-part by the emergence of the Solid State Drives (SSDs) that have demonstrated higher performance of speed and latency over the traditional hard drives. Unlike hard drives that depend on the magnetism to store data, solid state drives use non-volatile memory (e.g., NAND or NOR) devices to achieve data storage. The non-volatile memory devices are a family of integrated circuits that are manufactured by advanced process and assembly technologies to achieve multiple levels of vertical stacking of storages units into a small footprint of die and package for high capacity of storage.

Data are stored in cells of the non-volatile memory devices. These cells are generally organized in pages, and pages in blocks. A wordline (or word-line) is coupled to the control gates of the all cells of one page and shared by cells in the page. Data are read page by page by applying a read reference voltage (Vref) to the wordline. The read reference voltage is critical for the read performance of the page. The optimal read reference voltage gives the minimum raw Bit Error Rate (BER) value, therefore, provides the best read performance.

The optimal read reference voltage of a page changes as the non-volatile memory device's condition changes. These conditions include life cycle, temperature, data retention time, the amount of read disturbance, the locality of a wordline in a block, and so on. Therefore, tracking the optimal reference voltage is a challenge for non-volatile storage controllers. Conventionally, the number of ones in a page (1s count) is widely used to find the optimal reference voltage because the change of is count around the optimal read reference voltage is small. Finding the optimal reference voltage by using is count is done one by one for every Vref. To perform this process, normal data traffic has to be stopped to get the corresponding is count for each reference voltage. Accordingly, there is a need in the art to find the optimal reference voltage more efficiently.

SUMMARY

The present disclosure provides a system and method for dynamically tracking the read reference voltage and finding the optimal read reference voltage by comparing state information of data read using the read reference voltage with state information after decoding. The optimal read reference voltage may be obtained without stopping the normal data traffic. In one embodiment, probabilities of state error for a read reference voltage may be obtained from the pre-decoding and post-decoding state information, and a comparison of probabilities of state error of two adjacent states distinguished by the read reference voltage may be calculated. The comparison of probabilities of state error may be used to decide the direction and amount to adjust the read reference voltage.

For NVM cells each storing a one-bit value (e.g., SLC), a single read reference voltage may be used in a read operation to read data and this read reference voltage may be tracked and adjusted based on the comparison of probabilities of state error under the read reference voltage. For NVM cells each storing a multi-bit value (e.g., MLC or TLC), a plurality of read reference voltages may be used in a read operation (e.g., 3 read reference voltages for MLC and 7 read reference voltages for TLC), and the plurality of read reference voltages used for a read operation may be tracked and adjusted based on respective comparisons of probabilities of state error under each of plurality of read reference voltages at the same time while performing normal read operations. For example, the read reference voltage adjustment may be performed to find the optimal read references for different pages (LSB, CSB, and MSB) simultaneously.

Moreover, the disclosed method does not require background read scan which could potentially impact the system performance. In addition, the read reference voltage tracking in the embodiments may be more accurate by looking at the state distribution of all cells coupled to a wordline instead of only counting 0/1 within a page (which could be local optimal since only one read reference voltage is optimized at one time).

In an exemplary embodiment, there is provided a method that may comprise collecting pre-decoding state information for a read reference voltage by reading data stored in a non-volatile storage device using the read reference voltage, collecting post-decoding state information for the read reference voltage after decoding the data, generating a comparison of probabilities of state error for the read reference voltage based on the pre-decoding state information and post-decoding state information, obtaining an adjustment amount to the read reference voltage based on the comparison of probabilities of state error and adjusting the read reference voltage by applying the adjustment amount to the read reference voltage to obtain an adjusted read reference voltage.

In another exemplary embodiment, there is provided a storage system controller. The storage system controller may comprise an error correction code (ECC) engine comprising a decoder and a processor. The processor may be configured to: collect pre-decoding state information for a read reference voltage by reading data from a non-volatile storage device using the read reference voltage, collect post-decoding state information for the read reference voltage after the data read from the non-volatile storage device has been decoded by the decoder, generate a comparison of probabilities of state error for the read reference voltage based on the pre-decoding state information and post-decoding state information, obtain an adjustment amount to the read reference voltage based on the comparison of probabilities of state error; and adjust the read reference voltage by applying the adjustment amount to the read reference voltage to obtain an adjusted read reference voltage.

In yet another exemplary embodiment, there is provided a non-transitory machine-readable medium. The non-transitory machine-readable medium may have computer instructions that when executed by a storage controller, causes the storage controller to: collect pre-decoding state information for a read reference voltage by reading data from a non-volatile storage device using the read reference voltage, collect post-decoding state information for the read reference voltage after decoding the data, generate a comparison of probabilities of state error for the read reference voltage based on the pre-decoding state information and post-decoding state information, obtain an adjustment amount to the read reference voltage based on the comparison of probabilities of state error and adjust the read reference voltage by applying the adjustment amount to the read reference voltage to obtain an adjusted read reference voltage.

In yet another exemplary embodiment, there is provided a method that may comprise collecting pre-decoding state information for a set of read reference voltages by reading data stored in a non-volatile storage device using the set of read reference voltages, collecting post-decoding state information for the set of read reference voltages after decoding the data, generating comparisons of probabilities of state error for the set of read reference voltages based on the pre-decoding state information and post-decoding state information, obtaining a set of adjustment amounts to the set of read reference voltages based on the comparisons of probabilities of state error and adjusting the set of read reference voltages by applying the set of adjustment amounts to the set of read reference voltages to obtain a set of adjusted read reference voltages.

In yet another exemplary embodiment, there is provided a storage system controller. The storage system controller may comprise an error correction code (ECC) engine comprising a decoder and a processor. The processor may be configured to: collect pre-decoding state information for a set of read reference voltages by reading data from a non-volatile storage device using the set of read reference voltages, collect post-decoding state information for the set of read reference voltages after the data read from the non-volatile storage device has been decoded by the decoder, generate comparisons of probabilities of state error for the set of read reference voltages based on the pre-decoding state information and post-decoding state information, obtain a set of adjustment amounts to the set of read reference voltages based on the comparisons of probabilities of state error; and adjust the set of read reference voltages by applying the set of adjustment amounts to the set of read reference voltages to obtain a set of adjusted read reference voltages.

In yet another exemplary embodiment, there is provided a non-transitory machine-readable medium. The non-transitory machine-readable medium may have computer instructions that when executed by a storage controller, causes the storage controller to: collect pre-decoding state information for a set of read reference voltages by reading data from a non-volatile storage device using the set of read reference voltages, collect post-decoding state information for the set of read reference voltage after decoding the data, generate comparisons of probabilities of state error for the set of read reference voltages based on the pre-decoding state information and post-decoding state information, obtain a set of adjustment amounts to the set of read reference voltages based on the comparisons of probabilities of state error and adjust the set of read reference voltages by applying the set of adjustment amounts to the set of read reference voltages to obtain a set of adjusted read reference voltages.

DETAILED DESCRIPTION

Figure 1:
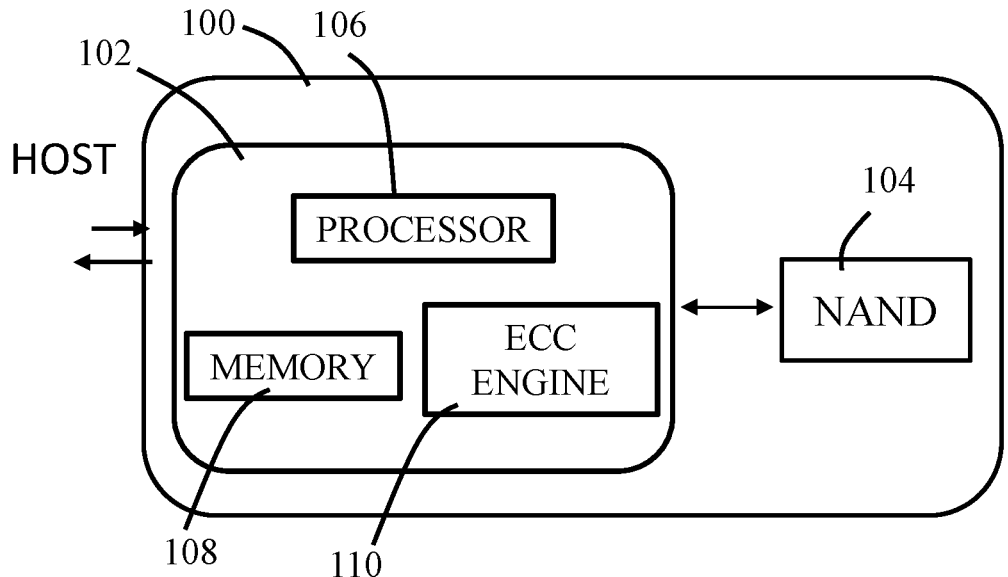
FIG. 1 schematically shows a non-volatile storage system in accordance with an embodiment of the present disclosure.

Specific embodiments according to the present disclosure will now be described in detail with reference to the accompanying figures. Like elements in the various figures are denoted by like reference numerals for consistency.

The present disclosure provides apparatuses, systems and methods for finding the optimal read reference voltage or set of optimal read reference voltages for reading data stored in non-volatile memory (NVM) storage devices that are encoded with an error-correcting code (ECC) (e.g., Turbo, Low-Density Parity-Check (LDPC), and Polar, etc.). The non-volatile storage system 100 may comprise a non-volatile storage controller 102 and a non-volatile storage device 104. The non-volatile storage system 100 may provide data storage and/or access to stored data for a host when it is coupled to the host. The non-volatile storage device 104 may be a non-volatile memory (NVM) based storage device, for example, a NAND device. It should be noted that the non-volatile storage system 100 may comprise a plurality of non-volatile storage devices and the non-volatile storage device 104 may be shown as a representative for the plurality of non-volatile storage devices.

The non-volatile storage controller 102 may comprise a processor 106, a memory 108 and an ECC engine 110. The processor 106 may be a computer processor, such as, but not limited to, a microprocessor or a microcontroller. The memory 108 may be a non-transitory computer-readable storage media, such as, DRAM or SRAM, to store computer executable instructions to be executed by the processor 106. The ECC engine 110 may comprise one or more ECC encoders and also may comprise one or more ECC decoders. The one or more ECC encoders may generate ECC data based on input data to be stored and the ECC data (including the input data) may be stored in the non-volatile storage device 104 in a write (program) operation. The one or more ECC decoders may decode ECC data retrieved from the non-volatile storage device 104 in a read operation and correct errors in the stored data retrieved from the non-volatile storage device 104.

Figure 2:
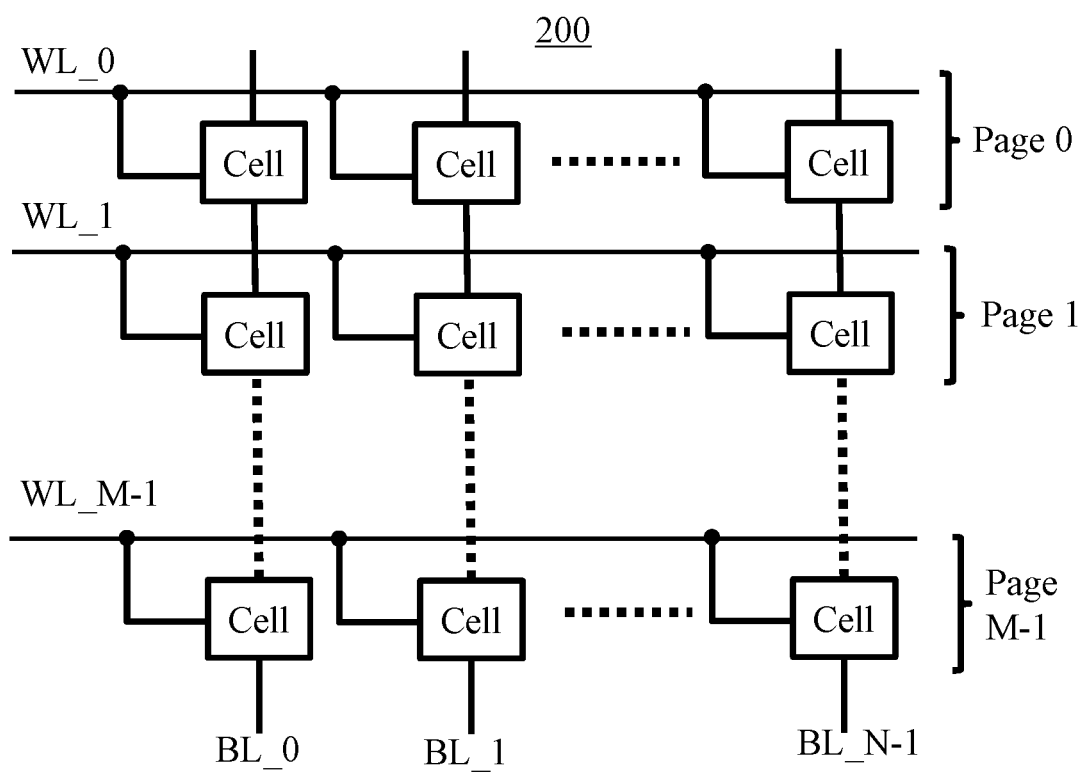
FIG. 2 schematically show a block of cells in a non-volatile storage device in accordance with an embodiment of the present disclosure.

FIG. 2 schematically show a block 200 of cells in a non-volatile storage device in accordance with an embodiment of the present disclosure. The non-volatile storage device 104 may comprise one or more dies. Each die may comprise one or more planes and each plane may comprise a plurality of blocks. The block 200 may comprise a plurality of cells organized in a two-dimensional array. The cells in each row may be coupled to one wordline (WL) and referred to as one page (e.g., a physical page). For example, cells of page 0 may have their respective control gates coupled to WL_0, cells of page 1 may have their respective control gates coupled to WL_1, and so on and so forth, until cells of page M-1 may have their respective control gates coupled to WL_M-1. In the column direction, cells may be coupled in series to a bitline (BL), for example, cells in the first column may be chained in series and coupled to BL_0, cells in the second column may be chained in series and coupled to BL_1, and so on and so forth, until cells in the Nth column may be chained in series and coupled to BL_N-1. It should be noted that the physical layout of the cells in a block may be different from the two-dimensional array shown in FIG. 2. But regardless of the physical layout structure, all cells of one physical page share one common wordline.

In one embodiment, the cells in the non-volatile storage device 104 may be a single-level cell (SLC) that may store a one-bit value. In another embodiment, the cells in the non-volatile storage device 104 may be a multi-level cell (MLC) that may store a two-bit value. The two-bit value may be represented as a tuple (LSB, MSB), where LSB is the least significant bit and MSB is the most significant bit. The LSBs stored in a wordline may form the LSB page and the MSBs stored in the wordline may form the MSB page. The LSB page and MSB page for an MLC non-volatile storage device may be referred to as logical pages. In yet another embodiment, the cells in the non-volatile storage device 104 may be a triple-level cell (TLC) that may store a three-bit value. The three-bit value may be represented as a tuple (LSB, CSB, MSB), where LSB is the least significant bit, CSB is the center significant bit and MSB is the most significant bit. The LSBs stored in a wordline may form the LSB page, CSBs stored in the wordline may form the CSB page and the MSBs stored in the wordline may form the MSB page. The LSB page, CSB page and MSB page for a TLC non-volatile storage device may also be referred to as logical pages. In yet other embodiments, the cells in the non-volatile storage device 104 may store other bit values (e.g., quad-level cell (QLC) for four-bit values), and the cells along one wordline may form more than three logical pages.

For cells storing one-bit values (e.g., SLC), each cell may be programmed in one of two threshold voltage states and data stored in the cells of one page may be read by applying one read reference voltage to the wordline in a read operation. For cells storing multi-bit values (e.g., MLC, TLC, or QLC), each cell may be programmed in one of more than two threshold voltage states (e.g., 4 states for MLC, 8 states for TLC) and data stored in the cells of one page may be read by applying a plurality of read reference voltages to the wordline in a read operation to obtain the bit values for the logical pages.

Figure 3:
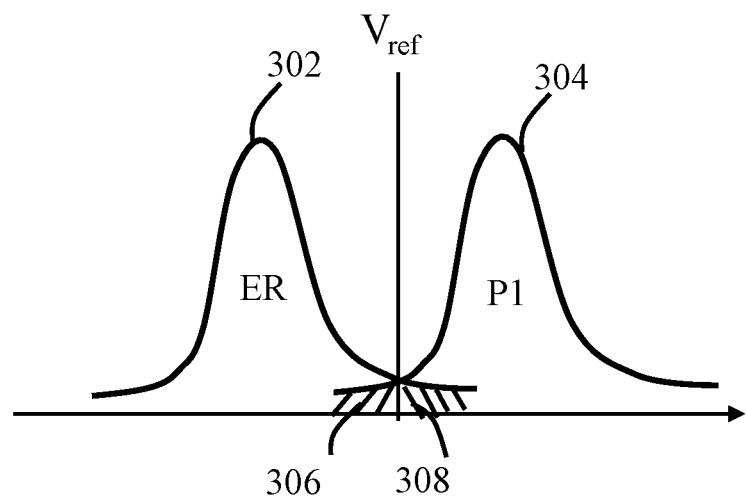
FIG. 3 schematically show state information in relation to a read reference voltage in accordance with an embodiment of the present disclosure.

FIG. 3 schematically show state information in relation to a read reference voltage $V_{ref}$ in accordance with an embodiment of the present disclosure. The horizontal axis in FIG. 3 may be the threshold voltage of storage cells in a SLC storage device. The vertical axis in FIG. 3 may be the probability distribution function of the threshold voltages of storage cells. The curve 302 in FIG. 3 may indicate distribution of cells in a first logic state, for example, logic one (or ER). The curve 304 in FIG. 3 may indicate distribution of cells in a second logic state, for example, logic zero (or P1). Data stored in one row of cells may be read in a read operation by applying the read reference voltage $V_{ref}$ to the wordline shared by the cells. The state information in FIG. 3 may be collected from the data read in the read operation. The first logic state and the second logic state may be two adjacent states distinguished by the read reference voltage $V_{ref}$.

As shown in FIG. 3, the curve 302 may have a tail portion 308 extending past the read reference voltage $V_{ref}$ into the territory that may be regarded as in the second logic state, and the curve 304 may have a tail portion 306 extending past the read reference voltage $V_{ref}$ into the territory that may be regarded as in the first logic state. That is, the correct logic state for bits in the tail portion 306 may be the second logic state, but because these bits' threshold voltages are smaller than the read reference voltage $V_{ref}$ they may be regarded as the first logic state. At the same time, the correct logic state for bits in the tail portion 308 may be the first logic state but because these bits' threshold voltages are larger than the read reference voltage $V_{ref}$ they may be regarded as the second logic state.

During a decoding process, the incorrectly labeled bits may be corrected. That is, during a decoding process by the decoder in the ECC engine 110, the bits in the portion 306 that may be incorrectly labeled as logic state one may be flipped to logic state two and bits in the portion 308 that may be incorrectly labeled as logic state two may be flipped to logic state one.

For a random data pattern, cells of a wordline may be evenly distributed among all states. A wordline may be referred to as a correctable wordline when all errors in any cell states (e.g., all logical pages) of the wordline can be corrected. In one embodiment, pre-decoding cell state information for all cells of a wordline may be collected by a read operation of the data stored in all cells of the wordline (e.g., obtaining all logical pages). The decoder may decode the data stored all cells of the wordline and correct any cell states incorrectly labeled. A probability of state error under one read reference voltage for one state may be obtained based on number of bits or number of cells flipped along the read reference voltage.

In some embodiments, pre-decoding state information may be collected for a read reference voltage by applying the read reference voltage to a wordline, a group of wordlines, or all wordlines of a block. Post-decoding state information for the read reference voltage may then be collected after decoding the data read from the non-volatile storage device. In the example of FIG. 3, the number of cells under the tail portion 306 may be represented as $T_{ER\rightarrow P1}$, which may the number of cells that should be ER but incorrectly read as P1 and corrected by the ECC decoder. The number of cells under the tail portion 308 may be represented as $T_{P1\rightarrow ER}$, which may the number of cells that should be P1 but incorrectly read as ER and corrected by the ECC decoder. The total number of cells in the state ER in FIG. 3 may be TER and the total number of cells in the state P1 in FIG. 3 may be TN. The numbers $T_{ER}$ and $T_{P1}$ may be obtained after decoding the data read from the non-volatile storage device. That is, in FIG. 3, the total number of cells under the curve 302 (including its tail 308) may be $T_{ER}$ and the total number of cells under the curve 304 (including its tail 306) may be $T_{P1}$. The probability of state error under the read reference voltage $V_{ref}$ for P1 may be represented as $Pr(v<V_{ref}|P1)$ and may be equal to $T_{P1\rightarrow ER}/T_{P1}$. The probability of state error under the read reference voltage $V_{ref}$ for ER may be represented as $Pr(v>V_{ref}|ER)$ and may be equal to $T_{ER\rightarrow P1}/T_{ER}$.

In embodiments that store data in multi-bit value cells, pre-decoding state information may be collected for a set of read reference voltages by applying the set of read reference voltages to a wordline, a group of wordlines, or all wordlines of a block. Post-decoding state information for the set of read reference voltages may then be collected after decoding the data read from the non-volatile storage device.

In various embodiments, the probability of state error of two adjacent states under the read reference voltage $V_{ref}$ may be compared to generate a comparison of probabilities of state error under the read reference voltage, which also may be referred to as the comparison of probabilities of state error for the read reference voltage. In one embodiment, the comparison of probabilities of state error may be represented as a wrong state ratio, for example, the wrong state ratio of wrong state ER to wrong state P1 for the read refence voltage $V_{ref}$ may be represented as $WSR(V_{ref})=Pr(v>V_{ref}|ER)/Pr(v<V_{ref}|P1)$, and the wrong state ratio of wrong state P1 to wrong state ER for the read refence voltage $V_{ref}$ may be represented as $WSR(V_{ref})=Pr(v<V_{ref}|P1)/Pr(v>V_{ref}|ER)$.

In another embodiment, the comparison of probabilities of state error may be represented by a wrong state difference. For example, the wrong state difference of wrong state ER to wrong state P1 for the read refence voltage $V_{ref}$ may be represented as $WSD(V_{ref})=Pr(v>V_{ref}|ER)-Pr(v<V_{ref}|P1)$. And the wrong state difference of wrong state P1 to wrong state ER for the read refence voltage $V_{ref}$ may be represented as $WSD(V_{ref})=Pr(v<V_{ref}|P1)-Pr(v>V_{ref}|ER)$.

A comparison of probabilities of state error is not limited to a wrong state ratio or a wrong state difference. In other embodiments, other mathematical relationship between two probabilities of state error may be used, for example, a wrong state logarithm ratio $\log_b(Pr(v>V_{ref}|ER))/\log_b(Pr(v<V_{ref}|P1))$ in which the logarithm base b may be any positive integer, or a wrong state squared difference $(Pr(v>V_{ref}|ER))^2-(Pr(v<V_{ref}|P1))^2$.

In various embodiments, a comparison of probabilities of state error for two adjacent states distinguished by the read reference voltage may be used to obtain an adjustment amount to the read reference voltage. For example, the comparison of probabilities of state error for one read reference voltage may be compared to a comparison of probabilities of state error obtained by an optimal read reference voltage, which may be referred to as the golden comparison of probabilities of state error for the read reference voltage. In another embodiment, the comparison of probabilities of state error for one read reference voltage may be compared to a plurality of comparisons of probabilities of state error obtained by read reference voltages including the optimal read reference voltage. In the present disclosure, the wrong state ratio may be used as an example for the comparison of probabilities of state error to illustrate how adjustment to the read reference voltage may be carried out using the comparison of probabilities of state error.

In one embodiment, a wrong state ratio for one particular read reference voltage may be compared to a wrong state ratio obtained by applying an optimal read reference voltage corresponding to the particular read reference voltage. The wrong state ratio obtained by applying the optimal read reference voltage may be referred to as a golden wrong state ratio for this particular read reference voltage. For example, for the TLC cells, there may be 7 golden wrong state ratios each for one of the seven optimal read reference voltages. That is, there may be optimal read reference voltages for $VR_0$ through $VR_6$, respectfully, and there may be a respective golden wrong state ratio for each of the optimal read reference voltages $VR_0$ through $VR_6$. The difference between the read reference voltage $V_{ref}$ to the corresponding optimal read reference voltage may be obtained and used as an adjustment to the read reference voltage $V_{ref}$. The adjusted read reference voltage may be used for the next read operation.

In one embodiment, the comparison of probabilities of state error for a current read reference voltage may be calculated wordline-wise, in which the current read reference voltage may be the read reference voltage applied to a wordline used in a current normal read operation for SLC cells, or the current read reference voltage may be one of a plurality of read reference voltages applied to a wordline in a current normal read operation for MLC or TLC cells. In another embodiment, the comparison of probabilities of state error for a current read reference voltage may be calculated wordline-group-wise, in which the current read reference voltage may be the read reference voltage applied to a group of wordlines used in current normal read operations for SLC cells and one of the plurality of read reference voltages applied to a group of wordlines in current normal read operations for MLC or TLC cells. In yet another embodiment, the comparison of probabilities of state error for a current read reference voltage may be calculated block-wise, in which the current read reference voltage may be the read reference voltage applied to wordlines of a block in current normal read operations for SLC cells and one of the plurality of read reference voltages applied to wordlines of a block in current normal read operations for MLC or TLC cells. In some embodiments, the current read reference voltage may be a default read reference voltage (e.g., recommended by the NAND vender).

Figure 4:
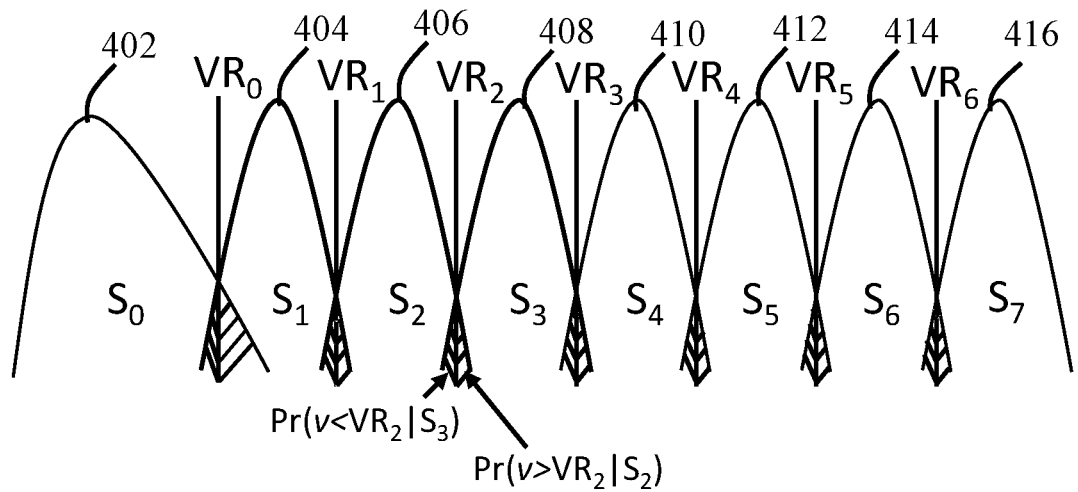
FIG. 4 schematically show state information in relation to a plurality of read reference voltages in accordance with an embodiment of the present disclosure.

FIG. 4 schematically show state information in relation to a plurality of read reference voltages in accordance with an embodiment of the present disclosure. The horizontal axis in FIG. 4 may be the threshold voltage of storage cells in a TLC storage device. The vertical axis in FIG. 4 may be the probability distribution function of the threshold voltages of storage cells. As each TLC cell may store a three-bit value, each TLC cell may be in one of eight states, $S_0$, $S_1$, $S_2$, $S_3$, $S_4$, $S_5$, $S_6$ and $S_7$. The curve 402 may indicate distributions of cells in state $S_0$, the curve 404 may indicate distributions of cells in state $S_1$, the curve 406 indicate distributions of cells in state $S_2$, the curve 408 may indicate distributions of cells in state $S_3$, the curve 410 may indicate distributions of cells in state $S_4$, the curve 412 may indicate distributions of cells in state $S_5$, the curve 414 may indicate distributions of cells in state $S_6$, and the curve 416 may indicate distributions of cells in state $S_7$. The read reference voltages $VR_0$, $VR_1$, $VR_2$, $VR_3$, $VR_4$, $VR_5$ and $VR_6$ may be applied to a wordline in a read operation to read the cells sharing the wordline and the cells may be distributed in eight states.

As shown in FIG. 4, the curves of cell states distribution may extend across the read reference voltages into neighboring states. For example, the curve 402 may have a tail portion extending passed the read reference voltage $VR_0$ into the state $S_1$. That is, there may be some cells which should have state $S_0$ but being read as in state $S_1$ because these cells' threshold voltage values exceed $VR_0$. In general, for any read reference voltage $VR_i$, with subscript lower case "i" being any one of 0 to 6, the probability of state error under the read reference voltage $VR_i$ for state $S_i$ may be represented as $Pr(v>VR_i|S_i)$ and may be equal to $T_{Si->Si+1}/T_{Si}$, in which $T_{Si}$ may be the number of cells in state $S_i$ after ECC decoding (e.g., correction) and $T_{Si->Si+1}$ may be the number of cells read as in state $S_{i+1}$ but changed to state $S_i$ after ECC decoding (e.g., correction). The probability of state error under the read reference voltage $VR_i$ for $S_{i+1}$ may be represented as $Pr(v<VR_i|S_{i+1})$ and may be equal to $T_{Si+1->Si}/T_{Si+1}$, in which $T_{Si+1}$ may be the number of cells in state $S_{i+1}$ after ECC decoding (e.g., correction) and $T_{Si+1->Si}$ may be the number of cells read as in state $S_i$ but changed to state $S_{i+1}$ after ECC decoding (e.g., correction).

In one embodiment, pre-decoding state information for the cells sharing one wordline may be obtained by a read operation, in which a plurality of read reference voltages for different states may be applied. Post-decoding state information for these cells may be obtained after the decoder in the ECC engine performs the decoding operation on the data obtained by the read operation. Thereafter, probabilities of errors for the states $Pr(v>VR_i|S_i)$ and $Pr(v<VR_i|S_{i+1})$ may be obtained from the pre-decoding and post-decoding state information. With $Pr(v>VR_i|S_i)$ and $Pr(v<VR_i|S_{i+1})$ obtained, the wrong state ratio of wrong state $S_i$ to wrong state $S_{i+1}$ for the read refence voltage $VR_i$ may be represented as $WSR(VR_i)=Pr(v>VR_i|S_i)/Pr(v<VR_i|S_{i+1})$, and the wrong state ratio of wrong state $S_{i+1}$ to wrong state $S_i$ for the read refence voltage $VR_i$ may be represented as $WSR(VR_i)=Pr(v<VR_i|S_{i+1})/Pr(v>VR_i|S_i)$. In another embodiment, the wrong state ratio may also be represented by a difference between the two probabilities of error. For example, the wrong state ratio of wrong state $S_i$ to wrong state $S_{1+1}$ for the read refence voltage $VR_i$ may be represented as $WSR(VR_i)=Pr(v>VR_i|S_i)-Pr(v<VR_i|S_{i+1})$. And the wrong state ratio of wrong state $S_{1+1}$ to wrong state $S_i$ for the read refence voltage $VR_i$ may be represented as $WSR(VR_i)=Pr(v<VR_i|S_{i+1})-Pr(v>VR_i|S_i)$.

As an example, assuming that $T_{S2}$ and $T_{S3}$ are the total numbers of cells in the state $S_2$ and $S_3$, respectively, after decoding (correcting any errors). The number of cells $T_{S2->S3}$, which may be number of cells in the state $S_3$ before decoding and in the state $S_2$ after decoding, may be obtained by comparing the pre-decoding cell state information to the post-decoding cell state information. And the probability of state error $Pr(v>VR_2|S_2)$ may be obtained as $T_{S2->S3}/T_{S2}$. Similarly, the number of cells $T_{S3->S2}$, which may be number of cells in the state $S_2$ before decoding and in the state $S_3$ after decoding, may also be obtained by comparing the pre-decoding cell state information to the post-decoding cell state information, and the probability of state error $Pr(v<VR_2|S_3)$ may be obtained as $T_{S3->S2}/T_{S3}$. The wrong state ratio for the given $VR_2$, $WSR(VR_2)$ may be obtained by comparing $\Pr(v<VR_2|S_3)$ and $\Pr(v>VR_2|S_2)$. The wrong state ratio $WSR(VR_2)$ may be used to find the optimal read reference voltage for $VR_2$ (e.g., by comparing to the golden wrong state ratio for the optimal read reference voltage $VR_2$).

Figure 5:
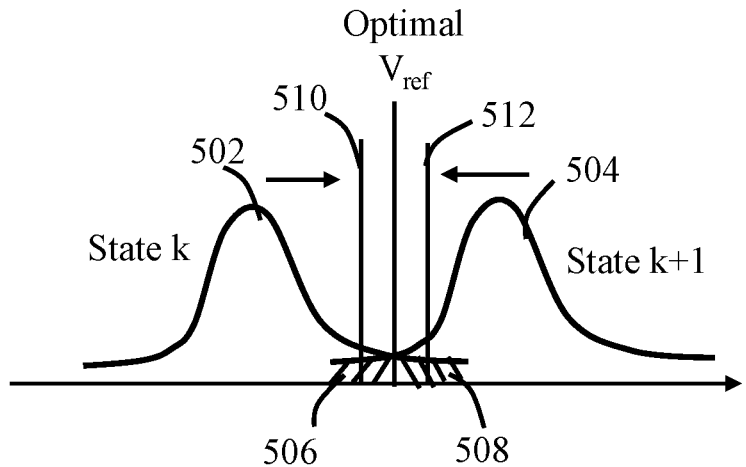
FIG. 5 schematically shows adjustment of a read reference voltage based on state information in accordance with an embodiment of the present disclosure.

FIG. 5 schematically shows adjustment of read reference voltage values based on state information in accordance with an embodiment of the present disclosure. By comparing post-decoding cell state information to pre-decoding cell state information, the comparison of probabilities of state error under the read reference voltage $V_{ref}$ for all reference voltages may be calculated. For SLC cells, there is only one read reference voltage and the wrong state ratio for this read reference voltage may be calculated. For MLC, TLC or QLC cells, there may be a plurality of read reference voltages, wrong state ratios may be calculated for all of the plurality of read reference voltages.

The curve 502 may represent distribution of cells in state k ($S_k$) and the curve 504 may represent distribution of cells in state k+1 ($S_{k+1}$) for one read reference voltage applied to a wordline shared by a row of cells. State k and state k+1 may be two states in SLC, or any two adjacent states in other devices that have more than two states (e.g., MLC, TLC or QLC). The curve 502 may have a tail portion 508 extending across the read reference voltage and the curve 504 may have a tail portion 506 extending across the read reference voltage.

When the read reference voltage is the read reference voltage 510, the tail portion 506 will be smaller than the tail portion 506 would have been if the read reference voltage is the optimal read reference voltage and the tail portion 508 will be larger than the tail portion 508 would have been if the read reference voltage is the optimal read reference voltage. That is, the wrong state ratio $\Pr(v<V_{ref}|S_{k+1})$ over $\Pr(v>V_{ref}|S_k)$ may be smaller than the wrong state ratio for the optimal read reference voltage. Therefore, if the wrong state ratio $\Pr(v<V_{ref}|S_{k+1})$ over $\Pr(v>V_{ref}|S_k)$ is smaller than the golden wrong state ratio for the optimal read reference voltage, it may be determined that $V_{ref}$ is smaller than the optimal read reference voltage and should be adjusted to increase to approach (e.g., adjusting to move to the right) the optimal read reference voltage.

On the other hand, when the read reference voltage is the read reference voltage 512, the tail portion 506 will be larger than the tail portion 506 would have been if the read reference voltage is the optimal read reference voltage and the tail portion 508 will be smaller than the tail portion 508 would have been if the read reference voltage is the optimal read reference voltage. That is, the wrong state ratio $\Pr(v<V_{ref}|S_{k+1})$ over $\Pr(v>V_{ref}|S_k)$ may be larger than the wrong state ratio for the optimal read reference voltage. Therefore, if the wrong state ratio $\Pr(v<V_{ref}|S_{k+1})$ over $\Pr(v>V_{ref}|S_k)$ is larger than the golden wrong state ratio for the optimal read reference voltage, it may be determined that $V_{ref}$ is larger than the optimal read reference voltage and should be adjusted to decrease to approach (e.g., adjusting to move to the left) the optimal read reference voltage.

It should be noted the optimal read reference voltage and the golden wrong state ratio may be acquired by doing NVM characterization for different NVM conditions. The NVM conditions may include, for example, but not limited to, life cycle, temperature, data retention time, the amount of read disturbance, the locality of a wordline in a block, and so on.

In one embodiment, not only the golden wrong state ratio and optimal read reference voltage may be available, a plurality of wrong state ratios for a plurality of possible reference voltages may be acquired and available, the offset between the current $VR_i$ and its corresponding optimal $VR_i$ may be identified by finding the read reference voltage which has the closest wrong state ratio to that of the current $VR_i$.

Table One may be an example for wrong state ratios for TLC cells with 1000 P/E cycles. "Optimal $V_{ref}$" may represent the optimal read reference voltage and the values of the column may be the golden wrong state ratio for the respective optimal read reference voltages $VR_0$ through $VR_6$. "Optimal $V_{ref}$-2" may represent the read reference voltage two offsets smaller than the respective optimal read reference voltage and the values of the column may be the wrong state ratios for the respective read reference voltages $VR_0$ through $VR_6$. "Optimal $V_{ref}$-1" may represent a read reference voltage one offset smaller than the respective optimal read reference voltage and the values of the column may be the wrong state ratios for the respective read reference voltages $VR_0$ through $VR_6$. "Optimal $V_{ref}$+1" may represent a read reference voltage one offset larger than the respective optimal read reference voltage and the values of the column may be the wrong state ratios for the respective read reference voltages $VR_0$ through $VR_6$. "Optimal $V_{ref}$+2" may represent a read reference voltage two offsets larger than the respective optimal read reference voltage and the values of the column may be the wrong state ratios for the respective read reference voltages $VR_0$ through $VR_6$. In one embodiment, the wrong state ratio values in the table may be referred to as table entry wrong state ratios.

TABLE ONE

|  | Optimal $V_{ref}$ − 2 | Optimal $V_{ref}$ − 1 | Optimal $V_{ref}$ | Optimal $V_{ref}$ + 1 | Optimal $V_{ref}$ + 2 |
| --- | --- | --- | --- | --- | --- |
| $WSR(VR_0)$ | 0.3 | 0.4 | 0.5 | 0.7 | 0.9 |
| $WSR(VR_1)$ | 0.8 | 0.9 | 1 | 1.1 | 1.2 |
| $WSR(VR_2)$ | 0.8 | 0.9 | 1 | 1.1 | 1.2 |
| $WSR(VR_3)$ | 0.9 | 0.95 | 1 | 1.05 | 1.1 |
| $WSR(VR_4)$ | 0.8 | 0.9 | 1 | 1.1 | 1.2 |
| $WSR(VR_5)$ | 0.8 | 0.9 | 1 | 1.1 | 1.2 |
| $WSR(VR_6)$ | 0.8 | 0.9 | 1 | 1.1 | 1.2 |

For example, the wrong state ratios after performing a read operation using a set of current read reference voltages (e.g., $VR_0$ through $VR_6$) may be obtained as 0.7 for $VR_0$, 0.9 for $VR_1$, 1.13 for $VR_2$, 1.12 for $VR_3$, 1.2 for $VR_4$, 0.8 for $VR_5$, and 0.92 for $VR_6$. Using Table One to find the closest table entry wrong state ratio for each current read reference voltage, the closest table entry wrong state ratio for $VR_0$ may be the wrong state ratio for Optimal $V_{ref}$+1 and the offset for shifting the current read reference voltage to approach the respective optimal read reference voltage may be −1, the closest table entry wrong state ratio for $VR_1$ may be the table entry wrong state ratio for Optimal $V_{ref}$−1 and the offset for shifting the current read reference voltage to approach the respective optimal read reference voltage may be +1, the closest table entry wrong state ratio for $VR_2$ may be the table entry wrong state ratio for Optimal $V_{ref}$+1 and the offset for shifting the current read reference voltage to approach the respective optimal read reference voltage may be −1, the closest table entry wrong state ratio for $VR_3$ may be the table entry wrong state ratio for Optimal $V_{ref}$+2 and the offset for shifting the current read reference voltage to approach the respective optimal read reference voltage may be −2, the closest table entry wrong state ratio for $VR_4$ may be the table entry wrong state ratio for Optimal $V_{ref}$+2 and the offset for shifting the current read reference voltage to approach the respective optimal read reference voltage may be −2, the closest table entry wrong state ratio for $VR_5$ may be the table entry wrong state ratio for Optimal $V_{ref}$−2 and the offset for shifting the current read reference voltage to approach the respective optimal read reference voltage may be +2, and the closest table entry wrong state ratio for $VR_6$ may be the table entry wrong state ratio for Optimal $V_{ref}$+1 and the offset for shifting the current read reference voltage to approach the respective optimal read reference voltage may be −1. For this particular example, the offsets obtained may be summarized in Table Two below.

TABLE TWO

|  | $VR_0$ | $VR_1$ | $VR_2$ | $VR_3$ | $VR_4$ | $VR_5$ | $VR_6$ |
|---|---|---|---|---|---|---|---|
| WSR for Current $V_{ref}$ | 0.7 | 0.9 | 1.13 | 1.12 | 1.2 | 0.8 | 0.92 |
| Read Reference Voltage for the closest table entry WSR | Optimal $V_{ref}+1$ | Optimal $V_{ref}-1$ | Optimal $V_{ref}+1$ | Optimal $V_{ref}+2$ | Optimal $V_{ref}+2$ | Optimal $V_{ref}-2$ | Optimal $V_{ref}+1$ |
| Shift Offset | −1 | +1 | −1 | −2 | −2 | +2 | +1 |

It should be noted that the number of offsets from the optimal read reference voltage in a wrong state ratio table may be an implementation choice. The example shown in Table One may provide two offsets in two directions (e.g., larger and smaller) of the optimal read reference voltage. Another embodiment may provide one offset, and yet another embodiment may provide three or more offsets. The voltage value in one offset may also be an implementation choice. For example, in one embodiment, one offset may be 10 mV, and in another embodiment, one offset may be 20 mV. In at least one embodiment, a wrong state ratio table may be built by scanning read reference voltages around each default read reference voltage provided by a NVM device vendor.

In some embodiments, the golden comparison of probabilities of state error or the table of the comparisons of probabilities of state error may be provided by a vender or manufacturer of the non-volatile storage device, a vender or manufacturer of the storage controller or a vender or manufacturer of the non-volatile storage system.

Figure 6:
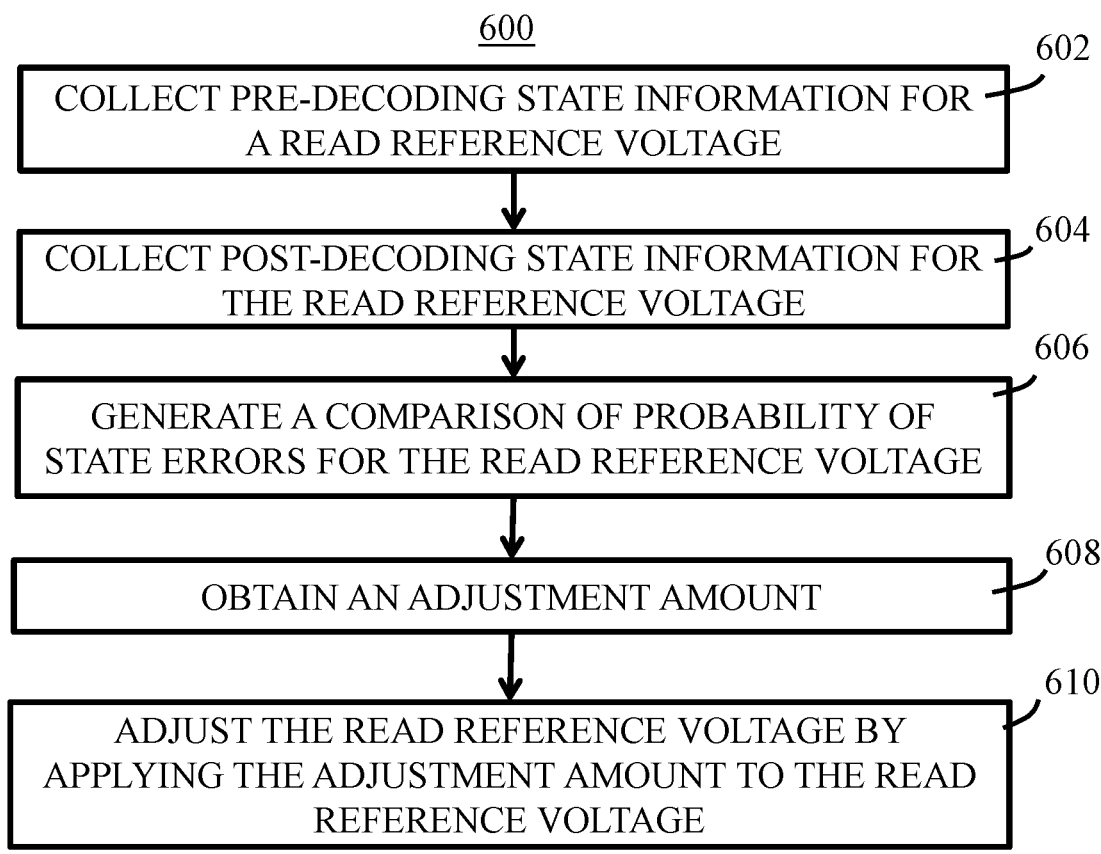
FIG. 6 is a flow diagram of a process for adjusting a read reference voltage based on pre-decoding and post-decoding state information in accordance with an embodiment of the present disclosure.

FIG. 6 is a flow diagram of a process 600 for adjusting a read reference voltage based on pre-decoding and post-decoding state information in accordance with an embodiment of the present disclosure. At block 602, pre-decoding state information may be collected for a read reference voltage. For example, a read reference voltage may be applied to a wordline, a group of wordlines, or all wordlines of a block to read data stored in a non-volatile storage device. For NVM cells that store single-bit values, a read operation may need only one read reference voltage. For example, for SLC cells, one read reference voltage may be applied to the wordline during the read operation to read data in the physical page, and the pre-decoding cell state information for cells of the wordline may be collected. For NVM cells that store multi-bit values, a read operation may need a plurality of read reference voltages to read the data. For example, for MLC cells, three read reference voltages may be applied on the wordline during the read operation to read data of the two logical pages (e.g., LSB, and MSB pages), and the pre-decoding cell state information for cells of the wordline may be collected by combining the read data of the two pages. For TLC cells, the read reference voltages $VR_0$ through $VR_6$ may be applied on a wordline during a read operation to read data of all three logical pages (e.g., LSB, CSB and MSB pages), and the pre-decoding cell state information for cells of the wordline may be collected by combining the read data of the three pages.

At block 604, post-decoding state information for the read reference voltage may be collected after decoding the data. For example, after ECC decoding, decoding results of the data read from a wordline, a group of wordlines or a block of wordlines may be collected and the post-decoding cell state information for each cell may be obtained.

At block 606, a comparison of probabilities of state error may be obtained for the read reference voltage based on the pre-decoding state information and post-decoding state information. For example, for a read reference voltage $V_{ref1}$, assuming that $N_{state0}$ and $N_{state1}$ are the total numbers of cells in the state $State_0$ and $State_1$, respectively, the pre-decoding cell state information may be compared to the post-decoding cell state information to get the number of cells ($N_{state0->state1}$) which are in the state $State_1$ before decoding and in the state $State_0$ after decoding. The probability of state error $Pr(v>V_{ref1}|State_0)$ may be obtained as $N_{state0->state1}/N_{state0}$. Similarly, number of cells ($N_{state1->state0}$) that are in the state $State_o$ before decoding and in the state $State_1$ after decoding may be obtained and probability of state error $Pr(v<V_{ref1}|State_1)$ may be obtained as $N_{state1->state0}/N_{state1}$. In one embodiment, the comparison of probabilities of state error may be a wrong state ratio for the reference voltage $V_{ref1}$ (e.g., $WSR(V_{ref1})$), which is set as $WSR(V_{ref1})=Pr(v<V_{ref1}|State_1)/Pr(v>V_{ref1}|State_0)$. In various embodiments, these two states State0 and State1 may be the ER and P1 states of SLC cells, or two adjacent states in other types of cells (e.g., two adjacent states of 4 states of MLC cells or two adjacent states of 8 states of TLC cells).

At block 608, an adjustment amount to the read reference voltage may be obtained based on the comparison of probabilities of state error. For example, the comparison of probabilities of state error may be compared to a golden comparison of probabilities of state error generated by an optimal read reference voltage. As an example, FIG. 4 shows that how a wrong state ratio may deviate from the golden wrong state ratio when the read reference voltage may be smaller or larger than the optimal read reference voltage, and an amount and direction of adjustment may be obtained. In another embodiment, a table of comparisons of probabilities of state error may be generated (e.g., the wrong state ratios in Table One) and the comparison of probabilities of state error for the read reference voltage may be compared to the comparisons of probabilities of state error in the table to obtain an adjustment amount. For example, a wrong state ratio obtained for a current $VR_0$ may be compared to wrong state ratios for $VR_0$ with different offsets from the optimal $VR_0$ in Table 1 and find a closest $VR_0$ to determine the amount of shift offset.

At block 610, the read reference voltage may be adjusted by applying the adjustment amount to obtain an adjusted read reference voltage. The adjusted read reference voltage may be used for the future read operation(s).

For SLC cells, one read reference voltage may be used in a read operation and the process 600 may be performed once for this read reference voltage. For other type of cells, more than one reference voltages may be applied on a wordline in a read operation (e.g., the set of read reference voltages $VR_0$ through $VR_6$ for TLC cells), and the process 600 may be performed for each of the plurality of read reference voltages used in a read operation.

Figure 7:
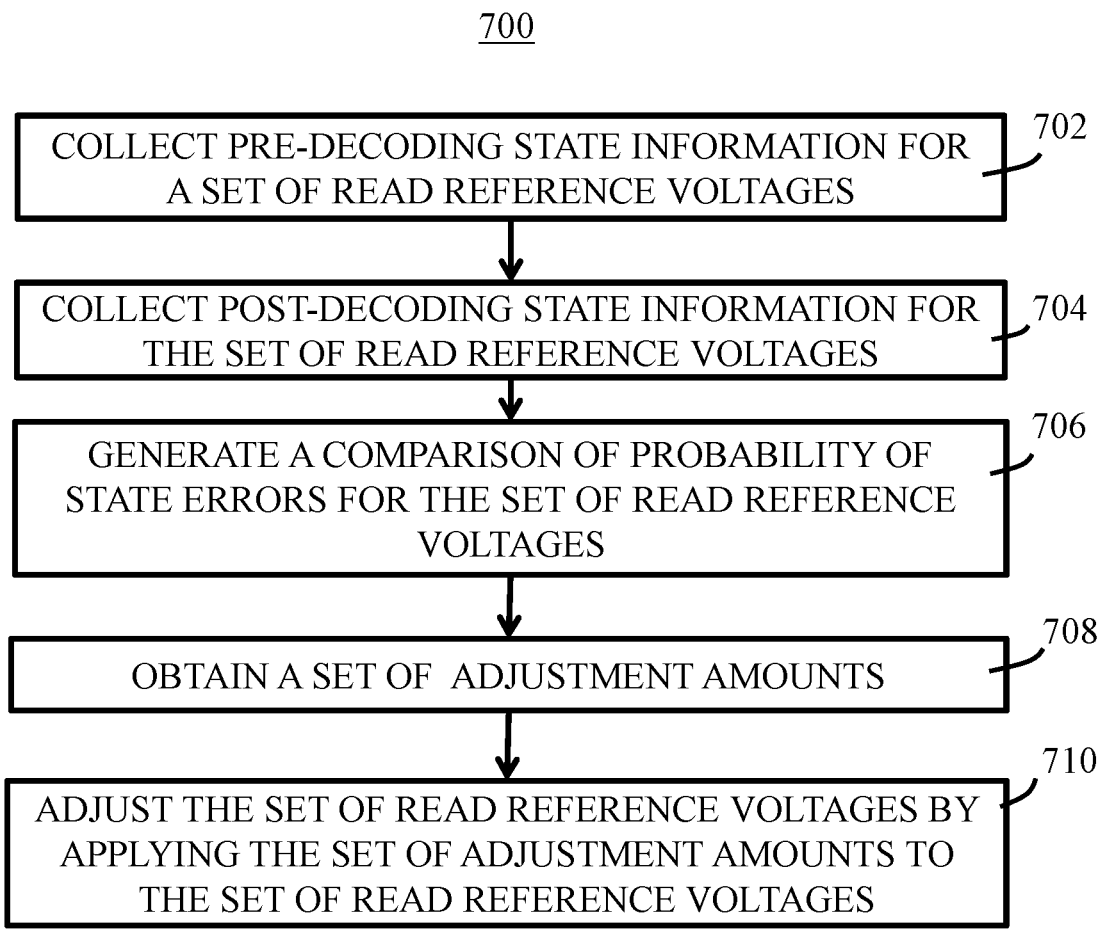
FIG. 7 is a flow diagram of a process for adjusting a set of read reference voltages based on pre-decoding and post-decoding state information in accordance with an embodiment of the present disclosure.

FIG. 7 is a flow diagram of a process 700 for adjusting a set of read reference voltages based on pre-decoding and post-decoding state information in accordance with an embodiment of the present disclosure. At block 702, pre-decoding state information may be collected for a set of read reference voltages. For example, a set of read reference voltages may be applied to a wordline, a group of wordlines, or all wordlines of a block of multi-bit value cells to read data stored in a non-volatile storage device.

At block 704, post-decoding state information for the set of read reference voltages may be collected after decoding the data. For example, after ECC decoding, decoding results of the data read from a wordline, a group of wordlines or a block of wordlines may be collected and the post-decoding cell state information for each cell may be obtained.

At block 706, comparisons of probabilities of state error may be obtained for the set of read reference voltages based on the pre-decoding state information and post-decoding state information. For example, comparisons of probabilities of state error for the set of read reference voltages $VR_0$ through $VR_6$ may be calculated for TLC cells.

At block 708, a set of adjustment amounts to the set of read reference voltages may be obtained based on the comparison of probabilities of state error. For example, a table of wrong state ratios (e.g., the wrong state ratios in Table One) may be used to obtain a set of adjustment amounts (e.g., the shifting offsets in Table Two) with each one for a respective read reference voltage of the set of read reference voltages.

At block 710, the set of read reference voltages may be adjusted by applying the set of adjustment amounts to obtain a set of adjusted read reference voltages. The set of adjusted read reference voltages may be used for the future read operation(s).

The processes 600 and 700 and features of the non-volatile storage system 100 related to tracking read reference voltage(s) may be implemented using software (e.g., executable by a computer processor (CPU, GPU, or both)), hardware (e.g., a field-programmable gate array (FPGA) or an application-specific IC (ASIC), firmware, or any suitable combination of the three. In one embodiment, for example, the processes 600 and 700 and features of the non-volatile storage system 100 related to tracking read reference voltage(s) may be programmed in computer processor executable instructions, stored in a non-transitory machine-readable medium (e.g., the memory 108, the non-volatile storage device 104, hard drive, CD, DVD, etc.) and performed by the processor 106 (e.g., a microprocessor or a microcontroller) executing the executable instructions.

In an exemplary embodiment, there is provided a method that may comprise collecting pre-decoding state information for a read reference voltage by reading data stored in a non-volatile storage device using the read reference voltage, collecting post-decoding state information for the read reference voltage after decoding the data, generating a comparison of probabilities of state error for the read reference voltage based on the pre-decoding state information and post-decoding state information, obtaining an adjustment amount to the read reference voltage based on the comparison of probabilities of state error and adjusting the read reference voltage by applying the adjustment amount to the read reference voltage to obtain an adjusted read reference voltage.

In one embodiment, the non-volatile storage device may contain cells that each may be configured to store a multi-bit value, the read reference voltage may be one of a plurality of read reference voltages used in a read operation, and adjustments for the plurality of read reference voltages may be obtained simultaneously without stopping normal data traffic.

In one embodiment, the comparison of probabilities of state error may be a wrong state ratio and obtaining the adjustment amount to the read reference voltage may comprise comparing the wrong state ratio to a golden wrong state ratio generated using an optimal read reference voltage.

In one embodiment, the comparison of probabilities of state error may be a wrong state ratio and obtaining the adjustment amount to the read reference voltage may comprise looking up a wrong state ratios table to find a table entry wrong state ratio closest to the wrong state ratio and obtain a shift offset amount for the table entry wrong state ratio as the adjustment amount.

In one embodiment, the comparison of probability of state error may be calculated wordline-wise, group-wordline-wise, or block-wise.

In one embodiment, the pre-decoding state information and post-decoding state information may include how many cells are in a first state, how many cells are in a second state, how many cells are corrected from the first state to the second state after decoding and how many cells are corrected from the second state to the first state after decoding.

In one embodiment, the wrong state ratio may be a comparison of a first probability of state error under the read reference voltage for the first state to a second probability of state error under the read reference voltage for the second state, and the comparison may be either a division or a subtraction.

In another exemplary embodiment, there is provided a storage system controller. The storage system controller may comprise an error correction code (ECC) engine comprising a decoder and a processor. The processor may be configured to: collect pre-decoding state information for a read reference voltage by reading data from a non-volatile storage device using the read reference voltage, collect post-decoding state information for the read reference voltage after the data read from the non-volatile storage device has been decoded by the decoder, generate a comparison of probabilities of state error for the read reference voltage based on the pre-decoding state information and post-decoding state information, obtain an adjustment amount to the read reference voltage based on the comparison of probabilities of state error; and adjust the read reference voltage by applying the adjustment amount to the read reference voltage to obtain an adjusted read reference voltage.

In one embodiment, the non-volatile storage device contains cells that each may be configured to store a multi-bit value, the read reference voltage may be one of a plurality of read reference voltages used in a read operation, and adjustments for the plurality of read reference voltages may be obtained simultaneously without stopping normal data traffic.

In one embodiment, the comparison of probabilities of state error may be a wrong state ratio and obtaining the adjustment amount to the read reference voltage may comprise comparing the wrong state ratio to a golden wrong state ratio generated using an optimal read reference voltage.

In one embodiment, the comparison of probabilities of state error may be a wrong state ratio and obtaining the adjustment amount to the read reference voltage may comprise looking up a wrong state ratios table to find a table entry wrong state ratio closest to the wrong state ratio and obtain a shift offset amount for the table entry wrong state ratio as the adjustment amount.

In one embodiment, the comparison of probability of state error may be calculated wordline-wise, group-wordline-wise, or block-wise.

In one embodiment, the pre-decoding state information and post-decoding state information may include how many cells are in a first state, how many cells are in a second state, how many cells are corrected from the first state to the second state after decoding and how many cells are corrected from the second state to the first state after decoding.

In one embodiment, the wrong state ratio may be a comparison of a first probability of state error under the read reference voltage for the first state to a second probability of state error under the read reference voltage for the second state, and the comparison may be either a division or a subtraction.

In yet another exemplary embodiment, there is provided a non-transitory machine-readable medium. The non-transitory machine-readable medium may have computer instructions that when executed by a storage controller, causes the storage controller to: collect pre-decoding state information for a read reference voltage by reading data from a non-volatile storage device using the read reference voltage, collect post-decoding state information for the read reference voltage after decoding the data, generate a comparison of probabilities of state error for the read reference voltage based on the pre-decoding state information and post-decoding state information, obtain an adjustment amount to the read reference voltage based on the comparison of probabilities of state error and adjust the read reference voltage by applying the adjustment amount to the read reference voltage to obtain an adjusted read reference voltage.

In one embodiment, the non-volatile storage device contains cells that each may be configured to store a multi-bit value, the read reference voltage may be one of a plurality of read reference voltages used in a read operation, and adjustments for the plurality of read reference voltages may be obtained simultaneously without stopping normal data traffic.

In one embodiment, the comparison of probabilities of state error may be a wrong state ratio and obtaining the adjustment amount to the read reference voltage may comprise comparing the wrong state ratio to a golden wrong state ratio generated using an optimal read reference voltage.

In one embodiment, the comparison of probabilities of state error may be a wrong state ratio and obtaining the adjustment amount to the read reference voltage may comprise looking up a wrong state ratios table to find a table entry wrong state ratio closest to the wrong state ratio and obtain a shift offset amount for the table entry wrong state ratio as the adjustment amount.

In one embodiment, the pre-decoding state information and post-decoding state information may include how many cells are in a first state, how many cells are in a second state, how many cells are corrected from the first state to the second state after decoding and how many cells are corrected from the second state to the first state after decoding.

In one embodiment, the wrong state ratio may be a comparison of a first probability of state error under the read reference voltage for the first state to a second probability of state error under the read reference voltage for the second state, and the comparison may be either a division or a subtraction.

In yet another exemplary embodiment, there is provided a method that may comprise collecting pre-decoding state information for a set of read reference voltages by reading data stored in a non-volatile storage device using the set of read reference voltages, collecting post-decoding state information for the set of read reference voltages after decoding the data, generating comparisons of probabilities of state error for the set of read reference voltages based on the pre-decoding state information and post-decoding state information, obtaining a set of adjustment amounts to the set of read reference voltages based on the comparisons of probabilities of state error and adjusting the set of read reference voltages by applying the set of adjustment amounts to the set of read reference voltages to obtain a set of adjusted read reference voltages.

In yet another exemplary embodiment, there is provided a storage system controller. The storage system controller may comprise an error correction code (ECC) engine comprising a decoder and a processor. The processor may be configured to: collect pre-decoding state information for a set of read reference voltages by reading data from a non-volatile storage device using the set of read reference voltages, collect post-decoding state information for the set of read reference voltages after the data read from the non-volatile storage device has been decoded by the decoder, generate comparisons of probabilities of state error for the set of read reference voltages based on the pre-decoding state information and post-decoding state information, obtain a set of adjustment amounts to the set of read reference voltages based on the comparisons of probabilities of state error; and adjust the set of read reference voltages by applying the set of adjustment amounts to the set of read reference voltages to obtain a set of adjusted read reference voltages.

In yet another exemplary embodiment, there is provided a non-transitory machine-readable medium. The non-transitory machine-readable medium may have computer instructions that when executed by a storage controller, causes the storage controller to: collect pre-decoding state information for a set of read reference voltages by reading data from a non-volatile storage device using the set of read reference voltages, collect post-decoding state information for the set of read reference voltage after decoding the data, generate comparisons of probabilities of state error for the set of read reference voltages based on the pre-decoding state information and post-decoding state information, obtain a set of adjustment amounts to the set of read reference voltages based on the comparisons of probabilities of state error and adjust the set of read reference voltages by applying the set of adjustment amounts to the set of read reference voltages to obtain a set of adjusted read reference voltages.

Any of the disclosed methods (e.g., the process 600) and operations may be implemented in software comprising computer-executable instructions stored on one or more computer-readable storage media. The one or more computer-readable storage media may include non-transitory computer-readable media (such as removable or non-removable magnetic disks, magnetic tapes or cassettes, solid state drives (SSDs), hybrid hard drives, CD-ROMs, CD-RWs, DVDs, or any other tangible storage medium), volatile memory components (such as DRAM or SRAM), or non-volatile memory components (such as hard drives)). The computer-executable instructions may be executed on a computer (e.g., any commercially available computer, including smart phones or other mobile devices that include computing hardware) by a computer processor (e.g., a CPU, a GPU, or both). Any of the computer-executable instructions for implementing the disclosed techniques as well as any data created and used during implementation of the disclosed embodiments may be stored on one or more computer-readable media (e.g., non-transitory computer-readable media). Such software can be executed, for example, on a single local computing device (e.g., any suitable commercially available computer or mobile device) or in a network environment (e.g., via the Internet, a wide-area network, a local-area network, a client-server network (such as a cloud computing network), or other such network) using one or more network computers.

Embodiments according to the present disclosure, may be implemented for any types of ECC codes, such as, but not limited to, rectangular parity, Turbo, Low-Density Parity-Check (LDPC), Polar, and Hamming code.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
    collecting pre-decoding state information for a read reference voltage by reading data stored in a non-volatile storage device using the read reference voltage;
    collecting post-decoding state information for the read reference voltage after decoding the data;
    obtaining a first probability of state error for a first state and a second probability of state error for a second state under the read reference voltage, wherein the first state and the second state are two adjacent states distinguished by the read reference voltage, the pre-decoding state information and the post-decoding state information include how many cells are in the first state before and after the decoding, how many cells are in the second state before and after the decoding, how many cells in the first state before the decoding are corrected to the second state after the decoding and how many cells in the second state before the decoding are corrected to the first state after the decoding, the first probability of state error is equal to a number of cells in the second state before the decoding corrected to the first state after the decoding divided by a total number of cells in the first state after the decoding, and the second probability of state error is equal to a number of cells in the first state before the decoding corrected to the second state after the decoding divided by a total number of cells in the second state after the decoding;
    generating a comparison of probabilities of state error for the read reference voltage by comparing the first probability of state error to the second probability of state error;
    obtaining an adjustment amount to the read reference voltage based on the comparison of probabilities of state error; and
    adjusting the read reference voltage by applying the adjustment amount to the read reference voltage to obtain an adjusted read reference voltage,
    wherein the comparison of probabilities of state error is a wrong state ratio and obtaining the adjustment amount to the read reference voltage is further based on the read reference voltage.

2. The method of claim 1, wherein the non-volatile storage device contains cells that each is configured to store a multi-bit value, the read reference voltage is one of a plurality of read reference voltages used in a read operation, and adjustments for the plurality of read reference voltages are obtained simultaneously while performing the read operation.

3. The method of claim 1, wherein the comparison of probabilities of state error is calculated wordline-wise, group-wordline-wise, or block-wise.

4. The method of claim 1, wherein the comparison of probabilities of state error is obtained by either a division or a subtraction.

5. A storage system controller, comprising:
    an error correction code (ECC) engine; and
    a processor configured to perform the method of claim 1.

6. The storage system controller of claim 5, wherein the non-volatile storage device contains cells that each is configured to store a multi-bit value, the read reference voltage is one of a plurality of read reference voltages used in a read operation, and adjustments for the plurality of read reference voltages are obtained simultaneously while performing the read operation.

7. The storage system controller of claim 5, wherein the comparison of probabilities of state error is calculated wordline-wise, group-wordline-wise, or block-wise.

8. The storage system controller of claim 5, wherein the comparison of probabilities of state error is obtained by either a division or a subtraction.

9. A non-transitory machine-readable medium having executable instructions, wherein the executable instructions, when executed by a storage controller, causes the storage controller to perform the method of claim 1.

10. The non-transitory machine-readable medium of claim 9, wherein the non-volatile storage device contains cells that each is configured to store a multi-bit value, the read reference voltage is one of a plurality of read reference voltages used in a read operation, and adjustments for the plurality of read reference voltages are obtained simultaneously while performing the read operation.

11. The non-transitory machine-readable medium of claim 9, wherein the comparison of probabilities of state error is obtained by either a division or a subtraction.

12. A method, comprising:
    collecting pre-decoding state information for a set of read reference voltages by reading data stored in a non-volatile storage device using the set of read reference voltages;
    collecting post-decoding state information for the set of read reference voltages after decoding the data;
    obtaining a first probability of state error for a first state under each read reference voltage of the set of read reference voltages and a second probability of state error for a second state under each read reference voltage of the set of read reference voltages, wherein the first state and the second state are two adjacent states distinguished by each read reference voltage, the pre-decoding state information and the post-decoding state information include how many cells are in the first state before and after the decoding, how many cells are in the second state before and after the decoding, how many cells in the first state before the decoding are corrected to the second state after the decoding and how many cells in the second state before the decoding are corrected to the first state after the decoding, the first probability of state error is equal to a number of cells in the second state before the decoding corrected to the first state after the decoding divided by a total number of cells in the first state after the decoding, and the second probability of state error is equal to a number of cells in the first state before the decoding corrected to the second state after the decoding divided by a total number of cells in the second state after the decoding;
    generating comparisons of probabilities of state error for the set of read reference voltages by comparing the first probability of state error for the first state to the second probability of state error for the second state under each read reference voltage;

obtaining a set of adjustment amounts to the set of read reference voltages based on the comparisons of probabilities of state error; and adjusting the set of read reference voltages by applying the set of adjustment amounts to the set of read reference voltages to obtain a set of adjusted read reference voltages, p1 wherein the comparisons of probabilities of state error are wrong state ratios and obtaining the set of adjustment amounts to the set of read reference voltages is further based on the set of read reference voltages.

13. A storage system controller, comprising:
an error correction code (ECC) engine; and
a processor configured to perform the method of claim 12.

14. A non-transitory machine-readable medium having executable instructions, wherein the executable instructions, when executed by a storage controller, causes the storage controller to perform the method of claim 12.

\* \* \* \* \*